United States Patent [19]

Zertani et al.

[11] Patent Number: 5,155,011
[45] Date of Patent: Oct. 13, 1992

[54] DEVELOPER CONCENTRATE AND DEVELOPER PREPARED THEREFROM FOR EXPOSED NEGATIVE-WORKING REPRODUCTION LAYERS WITH TOP LAYER AND A PROCESS FOR PRODUCING PRINTING FORMS

[75] Inventors: Rudolf Zertani, Mainz; Klaus Joerg, Ingelheim, both of Fed. Rep. of Germany

[73] Assignee: Hoechst Aktiengesellschaft, Frankfurt am Main, Fed. Rep. of Germany

[21] Appl. No.: 613,000

[22] Filed: Nov. 15, 1990

[30] Foreign Application Priority Data

Nov. 16, 1989 [DE] Fed. Rep. of Germany ....... 3938108

[51] Int. Cl.$^5$ ................................ G03F 7/32
[52] U.S. Cl. .................... 430/331; 252/156; 252/173; 252/174.14; 252/174.21; 252/174.22; 252/174.23; 252/174.24; 252/175; 252/525; 252/544; 430/325
[58] Field of Search ............... 430/331, 325; 252/156, 252/173, 174.14, 174.21, 174.22, 174.23, 174.24, 175, 525, 544

[56] References Cited

U.S. PATENT DOCUMENTS 4,469,776  9/1984  Matsumoto et al. ............... 430/331
4,588,836  5/1986  Matsumoto et al. ............... 435/25
4,716,098  12/1987 Mack et al. ....................... 430/331
4,851,324  7/1989  Hsieh ............................... 430/331

FOREIGN PATENT DOCUMENTS 080042  6/1983  European Pat. Off. ............ 430/331

Primary Examiner—Charles L. Bowers, Jr.
Assistant Examiner—Christopher G. Young
Attorney, Agent, or Firm—Foley & Lardner

[57] ABSTRACT

A developer concentrate is described which is used by diluting with tap water to give a read-to-use developer for negative-working exposed reproduction layers on a base. The developer concentrate is a mixture which includes water, an organic solvent, an alkali agent, an anionic surfactant, an n-alkanoic acid and/or its salts, an emulsifier, an alkali-metal salt of an oligomeric phosphate and/or of N-(2-hydroxyethyl)ethylenediaminetriacetic acid as complexing agent and also a tris(hydroxyalkyl) aminomethane as buffering substance. The developer concentrate according to the present invention exhibits, in particular, the advantage that it is stable as a concentrate, i.e., exhibits no phase separations, precipitates or turbidities, etc. . . . , and can be diluted without difficulties to produce the ready-to-use developer. The latter is also stable and exhibits optimum developer properties, in particular for reproduction layers with overcoat.

31 Claims, No Drawings

DEVELOPER CONCENTRATE AND DEVELOPER PREPARED THEREFROM FOR EXPOSED NEGATIVE-WORKING REPRODUCTION LAYERS WITH TOP LAYER AND A PROCESS FOR PRODUCING PRINTING FORMS

BACKGROUND OF THE INVENTION

The present invention relates to a developer concentrate capable of dilution with tap water to a ready-to-use state with tap water, which concentrate is suitable for developing negative-working exposed reproduction layers having a protective top layer in copying materials, and also a process for producing printing forms.

Copying materials of the type mentioned are used, in particular, in producing printing plates or photoresists and are composed of a layer base and a negative-working, photosensitive reproduction layer which may contain diazonium salt polycondensation products and/or photopolymerizable compounds as photosensitive components. The layer bases used in these copying materials are made of metals such as zinc, chromium, copper, brass, steel, aluminum or combinations of these metals, plastic sheets, paper or similar materials. The layer bases may be coated with the photosensitive reproduction layer without a modifying pretreatment. Preferably, however, the layer bases are coated after carrying out a surface modification such as a mechanical, chemical or electrochemical roughening, an oxidation and/or a treatment with hydrophilizing agents (for example, in offset printing plate bases).

Known developers or developer mixtures suitable for these copying materials have, in particular, the following disadvantages:

they often contain fairly high proportions of organic solvents which should, if possible, no longer be present in modern developers for ecological reasons such as a low boiling point, fire hazard, unpleasant smell, adverse effect on waste water and exhaust air and expensive precautions for eliminating the solvents after development;

although lauryl sulfate or other alkyl sulfates or alkanesulfonates conventionally often used in practice are, per se, effective developer components for the specified photosensitive reproduction layers, they require a comparatively long development time, they foam too extensively in processing machines, in particular in the case of vertical development, and the solubility in water at low temperatures (for example, from about 10° C. and lower) decreases to an extent such that, at autumn or Winter temperatures, flaky residues which are often troublesome for the processor may be produced in the stock solutions. Spots of grease and adhesive residues such as may occur in handling offset printing plates under practical conditions are removed by these developer components at best after a long action time and by additional mechanical aids;

although the lauryl sulfates or other alkyl sulfates or alkanesulfonates are frequently also suitable when used for the specific reproduction layers for which they were developed and with which they are also successfully used in the respective examples, they exhibit more or less considerable difficulties with layers which are different from these specific reproduction layers, i.e., they cannot be employed universally.

they also are unsuitable in general for suppressing the impurities (flakes and filaments) which are encountered in many cases, mainly in mechanical development, and which settle as redeposits on the printing forms, with the result that optimum quality of the final product cannot be achieved, even when the developer is used for a long time.

U.S. Pat. No. 4,716,098 describes a developer mixture which is different from the prior art described above, does not exhibit the disadvantages thereof and is suitable for developing lithographic printing plates. The layers described therein include a diazonium salt polycondensation product and an alkali-soluble binder which contains carboxyl groups. The developer mixture is stable only in very dilute form and can therefore exist only in dilute aqueous solution. The developer described includes up to 85% water, as a result of which unnecessarily large containers which have adverse effects on transport and application are needed.

SUMMARY OF THE INVENTION

It is therefore an object of the present invention to provide a developer concentrate for negative-working exposed reproduction layers which has a high solids content and also exhibits no precipitates, phase separations or turbidities on thawing even after a fortuitous freezing, can, if necessary, be diluted before use in the printing shop with water containing Ca and Mg ions, in particular tap water, to the extent necessary in practice without precipitates appearing in the process, develops rapidly and in doing so has equally ideal development properties (good resolution of the non-image areas and non-attack of the image areas) in order to enable it to be used in automatic processing systems, develops either as a concentrate or in the various degrees of dilution without flake and filament formation and at the same time has a high economy in use, i.e., can be used even over a prolonged period of time in its development capacity without forming contaminants, can be used either with binder-containing or with binder-free systems and is suitable for developing reproduction layers having a protective top layer.

A further object is to provide a developer derived by diluting the above-described concentrate with water. In addition, it is an object to provide a printing form and a process for producing the same with the present developer.

In accomplishing the foregoing objects there is provided according to the present invention a developer concentrate comprising a mixture of water, at least one organic solvent, at least one alkali agent, at least one anionic surfactant, at least one component selected from the group consisting of n-alkanoic acid, a salt of n-alkanoic acid and a mixture thereof, at least one emulsifier, at least one complexing agent comprising an alkali-metal salt of a compound selected from the group consisting of an oligomeric phosphate and N-(2-hydroxyethyl) ethylenediaminetriacetic acid, and at least one buffering substance comprising tris(hydroxyalkyl) aminomethane. There is also provided according to the present invention a developer for developing a negative-working exposed reproduction layer on a base, comprising the above-described developer concentrate diluted with tap water. The present invention further provides a process for producing a printing form which includes development with the present developer and a printing form produced by the process.

Further objects, features and advantages of the present invention will become apparent from the detailed description of preferred embodiments that follows.

DETAILED DESCRIPTION OF THE PREFERRED EMBODIMENTS

Tris(hydroxyalkyl)aminomethane, preferably tris(hydroxy($C_1$-$C_4$)alkyl)aminomethane and, in particular, tris(hydroxymethyl)aminomethane is used as the buffering substance in the present developer concentrate. The buffering substance used according to the present invention preferably is active in a pH range from about 8 to 12. The amount of buffering substance present in the developer concentrate is about 0.5 to 20.0% by weight, preferably about 0.7 to 10.0% by weight.

The developer prepared from the developer concentrate according to the present invention is distinguished by a high buffering capacity, which results from its low tendency to absorb $CO_2$. Particularly surprising is the fact that, as a result of the choice of precisely this buffering substance, the present developer is also suitable for developing reproduction layers having a protective top layer. These are mainly layers which contain photopolymerizable compounds.

The developer prepared from the developer concentrate according to the present invention is, however, also unrestrictedly suitable for developing reproduction layers without a top layer. These include, in particular, those layers which contain diazonium salt polycondensation products as negative-working photosensitive compounds and also photopolymerizable layers which have a low shelf life without a top layer.

Moreover, it is surprising that, as a result of the choice of the specific complexing agent and also of the buffering substance described, developer concentrates are obtained which exhibit no precipitates or phase separations; even in those instances where the concentrate is frozen and thawed several times.

The complexing agents used are the salts of low-molecular-weight phosphates, so-called oligophosphates, having 2 to 10, in particular 2 to 6, preferably 2 to 4, phosphorus units. Particularly preferred are the alkali-metal salts, in particular the sodium salts. Preferred complexing agents are tetrasodium diphosphate, pentasodium triphosphate and hexasodium tetraphosphate.

The alkali-metal salts, in particular the sodium salt, of N-(2-hydroxyethyl)ethylenediaminetriacetic acid are also used. These may be used alone or in combination with the low-molecular-weight phosphates. Particularly preferred, however, are developers which contain either a low-molecular-weight phosphate or the sodium salt of the triacetic acid.

The amount of complexing agents present in the developer concentrate is about 0.1 to 9.0% by weight, in particular about 0.5 to 6.0% by weight and preferably about 2.0 to 6.0% by weight. If the developer concentrate includes the alkali-metal salt of N-(2-hydroxyethyl)ethylenediaminetriacetic acid, the preferable amount of the triacetic acid is 2.0 to 5.0% by weight.

The developer concentrate according to the present invention furthermore includes n-alkanoic acids having 8 to 12 carbon atoms and/or their salts. Particularly good results are obtained with caprylic, pelargonic, capric and lauric acid. The developer concentrate includes these acids in an amount of about 1.0 to 16.0% by weight, in particular about 1.5 to 14.0% by weight Many anionic surface-active agents can be used as surfactants. In particular, those selected from the group comprising alkali-metal, preferably sodium, octyl sulfates, dodecylbenzenesulfonate, alkylphenol ether sulfates, naphthalenesulfonates, sulfosuccinates, alkyl ether phosphates or alkalimetal, preferably sodium, oleic acid methyl tauride, have proved especially successful. The anionic surface-active agent(s) are present in the developer concentrate in an amount of about 0.2 to 15.0% by weight, in particular in an amount of about 1.0 to 10.0% by weight, preferably in an amount of about 1.0 to 8.0% by weight.

The emulsifiers typically used are selected from the group comprising poly-N-vinyl-N-methylacetamide, water-soluble copolymers of N-vinyl-N-methylacetamide, polyvinyl alcohol, dextrin, gum arabic and cellulose ethers, in particular carboxymethylcellulose. The preferred amount of emulsifier in the developer concentrate is about 0.1 to 10.0% by weight, in particular about 0.2 to 6.0% by weight, preferably about 1.0 to 5.0% by weight.

Numerous known organic solvents may be used, but those which are selected from the group comprising benzyl alcohol, ethylene glycol monophenyl ether, 1-phenylethanol, 2-phenylethanol and propylene glycol monomethyl and monophenyl ether, in particular, have proved successful. The proportion of organic solvent in the developer concentrate is expediently about 0.5 to 15.0% by weight, in particular about 1.0 to 10.0% by weight, preferably about 5.0 to 10.0% by weight.

The alkali agents used are predominantly alkali-metal hydroxides, in particular LiOH, NaOH and KOH. The proportion of this agent in the developer concentrate is about 1.5 to 8.0% by weight, in particular about 1.5 to 6.0% by weight and preferably about 1.0 to 5.0% by weight.

Because only relatively low proportions of organic solvent are present in the developer mixture, the composition of the latter virtually remains unchanged during use and it consequently has a comparatively long service life in the developing apparatuses.

In general, the pH value of the developer concentrates according to the present invention is preferably about 8 to 12.

The present developer concentrates do not exhibit any troublesome odor nuisance and no precipitates occur even at temperatures around the freezing point in the claimed quantitative range of the components.

Use of the present invention enables effortless removal of adhesive residues (for example, from sticking on the film masters during copying) and grease spots (for example, from punching the printing plates) even with low developer action time. The development rate with the present invention is higher than with conventional developers and there is not observed any reduction in the developer resistance of the image regions. The salts of the alkanoic acids can also be degraded relatively easily as short-chain "soaps". No flake or filament formation which results in an undesirable contamination of the finished product and of the processing system can be observed.

In addition to the advantageous properties mentioned, it is particularly surprising that the concentrate also always remains homogeneous, even after it has been frozen for a prolonged time and then thawed.

A further advantage is that the developer concentrate according to the present invention can be diluted to the necessary extent at the user's premises. In so doing, even water with a high content of Ca and Mg ions can be used without precipitates being produced. The concentrated form has the additional advantage that the volume to be transported is lower and therefore the transportation costs are less. This is relevant, in particular, in the case of exported products.

The developer concentrate according to the present invention can in principle be used for most of the known negative-working reproduction layers. To dilute the concentrate to give the ready-to-use developer for a negative-working, exposed reproduction layer on a base, normal tap water, which includes, in particular, Ca and Mg ions, can be used. The dilution ratio of concentrate to tap water ranges from about 1:0.5 to 1:6 and is preferably about 1:1 to 1:3.

The reproduction layers to be developed may contain either known binders or be binder-free. Preferably, however, the developer concentrate is used with binder containing reproduction layers. The photosensitive components contained in such reproduction layers are, for example, diazonium salt polycondensation products.

Preferable diazonium salt polycondensation products are condensation products of condensable aromatic diazonium salts, for example of diphenylamine-4-diazonium salts, with aldehydes, preferably formaldehyde. Use is made with particular advantage of co-condensation products which contain, in addition to the diazonium salt units, other non-photosensitive units which are derived from condensable compounds, in particular aromatic amines, phenols, phenol ethers, aromatic thioethers, aromatic hydrocarbons, aromatic heterocycles and organic acid amides. These condensation products are described in DE-A 2,024,244. All the diazonium salt polycondensation products which are described in DE-A 2,739,774 are generally suitable.

The diazonium salt units A-N$_2$X are preferably derived from compounds of the formula $(R^8—R^9—)_pR^{10}—N_2X$, where X is the anion of the diazonium compound,
p is an integer from 1 to 3,
R$^8$ is an aromatic radical having at least one position capable of condensation with an active carbonyl compound,
R$^{10}$ is a phenylene group,
R$^9$ is a single bond or one of the following groups:

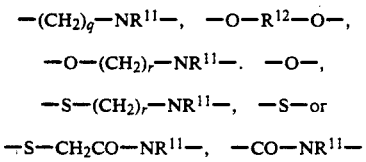

wherein
q is a number from 0 to 5,
r is a number from 2 to 5,
R$^{11}$ is hydrogen, an alkyl group having 1 to 5 carbon atoms, an aralkyl group having 7 to 12 carbon atoms or an aryl group having 6 to 12 carbon atoms, and
R$^{12}$ is an arylene group having 6 to 12 carbon atoms.

The mixtures which can be developed with the present developer include, in general, 5 to 90, preferably 10 to 70% by weight of diazonium compound.

To stabilize the photosensitive mixture, it is advantageous to add a compound having an acidic nature to it. Mineral acids and strong organic acids are desirable, and of these, phosphoric acid, sulfuric acid, perchloric acid, boric acid or p-toluenesulfonic acid are preferred. A particularly well-suited acid is phosphoric acid.

Plasticizers, adhesion promoters, dyestuffs, pigments and color couplers may furthermore be added to the mixtures.

The nature and amount of these additives depends on the field of application envisaged for the photosensitive mixture. In this connection, it is necessary to ensure that the substances added do not absorb an excessive proportion of the actinic light necessary for crosslinking and thereby reduce the practical photosensitivity.

The photosensitive mixtures may furthermore include dyestuffs and/or pigments which may act both as contrast agents and as layer consolidators. Preferable dyestuffs are, for example, specified in U.S. Pat. Noa. 3,218,167 and No. 3,884,693. Particularly preferable are, for example, Victoria pure blue FGA, Renol blue B2G-H (C.I. 74160), crystal violet or rhodamine 6 GDN (C.I. 45160). To increase the image contrast after exposure, metanil yellow (C.I. 13065), methyl orange (C.I. 13025) or phenylazodiphenylamine may be used.

Photopolymerizable compounds may also be used as photosensitive compounds. The layers having these compounds have, as essential constituents, a polymeric binder, a radical-polymerizable compound containing at least one, preferably at least two, terminal ethylenic unsaturated groups and also a polymerization initiator or an initiator combination which can be activated by actinic light. Preferably, reproduction layers of this type are protected, particularly against atmospheric oxygen, by a top layer.

Normally, such protective top layers include a polymer which reduces the oxygen permeability through the overcoat layer. In particular, polyvinyl alcohol, polyvinylpyrrolidone or gelatine are used. The protective top layer may, however, also include specific oxygen-binding, water-soluble polymers containing aliphatic amino groups. Such compounds are described in German Patent Application P 3,825,836.6.

The protective top layer should be transparent to actinic light and has, in general, a thickness of about 0.5 to 10μm, preferably of about 1 to 4 μm. It contains, in general, about 3 to 60% by weight, preferably about 5 to 40% by weight, of the oxygen-binding polymer. The protective top layer is applied to the photopolymerizable layer in a known manner from aqueous solution or from a mixture of water and organic solvent. It is possible to add to the coating solution up to about 10% by weight, preferably up to about 5% by weight, based on its solids content, of a surface-active agent to improve wetting. Desirable surface-active agents include the anionic, cationic and nonionic ones, for example sodium alkyl sulfates and alkanesulfonates containing 12 to 18 carbon atoms such as sodium dodecyl sulfate, N-cetyl and C-cetylbetaines, alkyl aminocarboxylates and -dicarboxylates and also polyethylene glycol having a mean molecular weight of up to about 400.

In the photopolymerizable layer, those polymerizable compounds which are described in U.S. Pat. No. 2,760,863 and No. 3,060,023 are particularly suitable.

Preferred examples are acrylic and methacrylic acid esters of dihydric or polyhydric alcohols such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols or N-substituted acrylic and methacrylic acid amides. Reaction products of mono- or diisocyanates with partial esters of polyhydric alcohols are also advantageously used. Such monomers are described in DE-A 2,064,079, 2,361,041 and 2,822,190.

Polymerizable compounds which contain at least one photooxidizable and possibly at least one urethane group in the molecule may also be used.

Such monomers are described in DE-A 3,710,279, 3,710,281 and 3,710,282.

The compounds described in German Patent Applications P 3,825,836.6 and P 3,832,032.0 and containing photooxidizable groups can also be used.

A multiplicity of substances can be used as photoinitiators. Examples are those which are derived from the parent substance of the benzophenones, acetophenones, benzoins, benzils, benzil monoketals, of fluorenone, thioxanthone, of the polynuclear quinones, acridines and quinazolines; and also trichloromethyl-s-triazines, 2-halomethyl-5-vinyl-1,3,4-oxadiazole derivatives, halooxazoles substituted with trichloromethyl groups or carbonylmethylene heterocycles containing trihalomethyl groups, such as are described in DE-A 3,333,450.

Preferred photoinitiators are photoreducible dyestuffs, in particular in combination with the trihalomethyl compounds which can be split by exposure to illumination and possibly with acridine, phenazine or quinoxaline compounds which are active as photoinitiators, such as are described in DE-A 3,710,281 and 3,710,282.

The total amount of polymerization initiators is, in general, about 0.05 to 20, preferably about 0.1to 10, % by weight.

Depending on the planned application and on the desired properties, the photopolymerizable layers may include diverse substances as additives. Examples are: inhibitors to prevent thermal polymerization of the monomers, hydrogen donors, dyestuffs, dyed and undyed pigments, color couplers, indicators, plasticizers and chain transfer agents. These constituents should expediently be so selected that they have as low an absorption as possible in the actinic radiation range which is important for the initiation process.

The developer according to the present invention is also suitable for developing negative-working, photosensitive layers which contain both a diazonium salt polycondensation product and also a photopolymerizable compound.

Examples of preferred binders are chlorinated polyethylene, chlorinated polypropylene, alkyl poly(meth-)acrylates in which the alkyl group is, for example, methyl, ethyl, n-butyl, i-butyl, n-hexyl or 2-ethylhexyl, copolymers of the said alkyl (meth)acrylates with at least one monomer such as acrylonitrile, vinyl chloride, vinylidene chloride, styrene or butadiene; polyvinyl chloride, vinyl chloride/acrylonitrile copolymers, polyvinylidene chloride, vinylidene chloride/acrylonitrile copolymers, polyvinyl acetate, polyvinyl alcohol, polyacrylonitrile,acrylonitrile/styrenecopolymers, acrylonitrile/butadiene/styrene copolymers, polystyrene, polymethylstyrene, polyamides (for example nylon-6), polyurethanes, methylcellulose, ethylcellulose, acetylcellulose, polyvinyl formal and polyvinyl butyral.

Particularly suitable are binders which are insoluble in water, soluble in organic solvents and soluble or at least swellable in aqueous alkaline solutions.

Particular mention should be made of binders containing carboxyl groups, for example copolymers of (meth)acrylic acid and/or its unsaturated homologs such as crotonic acid, copolymers of maleic anhydride or its half-esters, reaction products of polymers containing hydroxyl groups with dicarboxylic acid anhydrides and also mixtures thereof.

Furthermore, reaction products of polymers which carry H-acid groups which have been completely or partially reacted with activated isocyanates such as, for example, reaction products of polymers containing hydroxyl groups with aliphatic or aromatic sulfonyl isocyanates or phosphinic acid isocyanates are suitable.

In addition, the following can also be used: polymers containing hydroxyl groups such as, for example, copolymers of hydroxyalkyl (meth)acrylates, copolymers of allyl alcohol, copolymers of vinyl alcohol, polyurethanes or polyesters such as epoxy resins, provided they carry an adequate number of free OH groups or have been so modified that they are soluble in aqueous alkaline solutions, or those polymers which carry aromatically-bound hydroxyl groups such as, for example, condensation products of condensable carbonyl compounds, in particular formaldehyde, acetaldehyde or acetone, with phenols, or copolymers of hydroxystyrenes. Finally, copolymers of (meth)acrylamide with alkyl (meth)acrylates can also be used.

The polymers described above are preferable, in particular, if they have a molecular weight of between about 500 and 200,000 or over, preferably about 1,000 to 100,000 and either have acid values of between about 10 and 250, preferably from about 20 to 200, or hydroxyl values of between about 50 and 750, preferably from about 100 to 500.

The following are preferred alkali-soluble binders: copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinylacetic acid with alkyl (meth)acrylates, copolymers of maleic anhydride with optionally substituted styrenes, unsaturated hydro-carbons, unsaturated ethers or esters, esterification products of copolymers of maleic anhydride, esterification products of polymers containing hydroxyl groups with anhydrides of di- or polycarboxylic acids, copolymers of hydroxyalkyl (meth)acrylates with alkyl (meth)acrylates, (meth)acrylonitrile or the like, copolymers of allyl alcohol with optionally substituted styrenes, copolymers of vinyl alcohol with alkyl (meth)acrylates or other unsaturated compounds capable of polymerization, polyurethanes provided they contain an adequate number of free OH groups, epoxy resins, polyesters, partially saponified vinyl acetate copolymers, polyvinyl acetals containing free OH groups, copolymers of hydroxystyrene with alkyl (meth)acrylates or the like, phenol-formaldehyde resins, for example novolaks.

The amount of the binder in the photosensitive layer is, in general, about 20 to 90, preferably about 40 to 80, % by weight.

The following can be developed with the developer according to the present invention: copying layers for the photomechanical production of printing forms for letter press printing, lithography, gravure printing and screen printing, of embossed copies, for example production of texts in Braille, of individual copies, tannin images, carbon images, etc. The copying layers are of particular importance for the production of lithographic plates and for the photoresist technique.

Preferable layer bases for the developable copying material comprise, for example, aluminum, steel, zinc, copper and plastic sheets made of, for example, polyethylene terephthalate, and also screen printing bases such as Perlon gauze. In many cases it is beneficial to subject the base surface to a pretreatment (chemical or mechanical) whose object is to prepare the adhesion of the layer correctly, to improve the lithographic properties of the base surface or to reduce the reflecting power of the base in the actinic region of the copying layer (halation protection).

The photosensitive materials are produced in a known manner. Thus, the layer constituents can be taken up in a solvent and the solution or dispersion applied by casting, spraying, immersion, application with rollers, etc. . . , to the base provided and then dried.

The copying material which can be developed with the developer according to the present invention can be exposed with any light source familiar to the person skilled in the art, for example with tubular lamps, xenon pulse lamps, metal halide doped mercury high pressure lamps and carbon arc lamps. In addition, exposure in standard projection and enlargement apparatuses under the light of metal filament lamps and contact exposure with normal incandescent bulbs are possible. The exposure can also be carried out with coherent light from a laser. Suitable for the purposes of the present invention are lasers of the correct power, for example argon ion, krypton ion, dyestuff, helium/cadmium and helium/neon lasers which emit, in particular, between about 250 and 650 nm.

The materials are processed further in a known manner. To improve crosslinking of the layer, an afterheating can be carried out after exposure.

The present invention also relates to a process for producing a printing form, which comprises applying a negative-working layer which includes, optionally, diazonium salts and/or, optionally, binder to a carrier, preferably of aluminum or its alloys which has been pretreated and/or hydrophilized, in particular, mechanically and/or chemically and/or electrochemically, exposing the layer to an image and then developing it with the developer according to the present invention which is prepared by diluting the concentrate according to the present invention with water. During the development of reproduction layers having a top layer, the entire overcoat is removed by the developer together with the unexposed regions of the photopolymerizable layer.

Exemplary embodiments of the present invention are specified below. In these, parts by weight (pbw) and parts by volume (pbv) are in the ratio of g to ccm. Percentage and quantitative ratios are to be understood in units of weight, unless otherwise specified.

Table 1 below shows various developer compositions. The quantitative data relate to the respective concentrate. When the concentrates are used, first the liquid constituents and then the solid substances are added while stirring to an amount of deionized water, determined as a difference, up to 100% by weight. After everything has been homogeneously dissolved, the concentrate is filtered. For the purpose of development, the concentrates obtained are diluted in the specified ratio with water. The pH of the developers is about 7.5 to 9.

The developers A and C to F are comparison substances since they contain a buffering compound which is different from the present buffering substance.

The comparison substances C to F all exhibit precipitates in the concentrate and in the developer, while the developers A and B and also G to M exhibit no phase separations and provide a completely clear solution. The developers A and C to F are not suitable for layers having a top layer. In order to be able to use the developer with these layers as well, the overcoat has to be washed off before development.

TABLE I

Developer compositions in percent by weight

| Constituents | A | B | C | D | E | F | G | H | I | K | L | M |
|---|---|---|---|---|---|---|---|---|---|---|---|---|
| Pelargonic acid | 8.2 | 8.2 | 8.2 | 8.2 | 8.2 | 8.2 | 8.2 | 8.2 | 8.2 | 8.2 | 8.2 | 8.2 |
| Octyl sulfate | 4.0 | 4.0 | 4.0 | 4.0 | 4.0 | 4.0 | 6.2 | 6.2 | 6.2 | 6.2 | 6.2 | 6.2 |
| Ethylene glycol monophenyl ether | 6.2 | 6.2 | 6.2 | 6.2 | 6.2 | 6.2 | 6.2 | 6.2 | 6.2 | 6.2 | 6.2 | 6.2 |
| $K_2B_4O_7 \times 4H_2O$ | 2.0 | — | — | — | — | — | — | — | — | — | — | — |
| KOH, solid | 2.8 | 2.8 | 2.8 | 2.8 | 2.8 | 2.8 | 2.8 | 2.8 | 2.8 | 2.8 | 2.8 | 2.8 |
| Pentasodium triphosphate | 4.0 | 4.0 | 4.0 | 4.0 | 4.0 | 4.0 | 3.1 | 3.1 | 3.1 | 3.1 | 3.1 | 3.1 |
| Poly-N-vinyl-N-methylacetamide | 1.0 | 1.0 | 1.0 | 1.0 | 1.0 | 1.0 | 1.0 | 1.0 | 1.0 | 1.0 | 1.0 | 1.0 |
| Tris(hydroxymethyl)aminomethane | — | 2.0 | — | — | — | — | 0.3 | 0.6 | 1.3 | 2.0 | 2.6 | 4.0 |
| Sodium silicate | — | — | 2.0 | — | — | — | — | — | — | — | — | — |
| Sodium metasilicate | — | — | — | 2.0 | — | — | — | — | — | — | — | — |
| $Na_3PO_4$ | — | — | — | — | 2.0 | — | — | — | — | — | — | — |
| $Na_2HPO_4$ | — | — | — | — | — | 2.0 | — | 3.3 | — | — | — | — |
| Developer concentrate deionized water | ad 100% | | | | | | | | | | | |
| Developer: water: concentrate dilution ratio | | | | | | 1:1 | | | | 2:1 | | 1:1 |

In the following examples, the developers presented above are tested:

EXAMPLE 1

An electrochemically roughened, anodically oxidized aluminum foil in sheet form treated with an aqueous solution of polyvinylphosphonic acid is coated with a solution composed of 62 pbw of a polymer prepared by reflux heating using a polyvinyl butyral having a molecular weight of about 70,000 to 80,000 which contains 71% vinyl butyral, 2% vinyl acetate and 27% vinyl alcohol units, maleic anhydride, methyl ethyl ketone and trimethylamine, 21 pbw of a diazonium salt polycondensation product prepared from 1 mol of 3-methoxydiphenylamine-4-diazonium sulfate and 1 mol of 4,4'-bis(methoxymethyl)diphenyl ether in 85%-strength phosphoric acid and isolated as mesitylene sulfonate, 2.5 pbw of phosphoric acid (85% strength), 3 pbw of Victoria pure blue FGA (C.I. basic blue 81) and 0.6 pbw of phenylazodiphenylamine in 2570 pbw of ethylene glycol monomethyl ether and 780 pbw of tetrahydrofuran.

The copying layer obtained in this way, which after drying has a layer weight of 0.95 g/m², is exposed for 30 seconds using a metal halide lamp with a power of 5 kW and developed with the developer concentrates A to M which had previously been diluted by adding tap water in the specified ratio. For the reasons cited above, only the developers prepared from the concentrates A and B and also G to M are suitable for developing this copying layer.

No turbidities or precipitates are observed with the diluted concentrates A, B and G to M either. The development times are practical and the non-image areas are cleanly developed. No flake or filament formation can be observed. When the diluted developer concentrate is used in a standard machine to develop and produce a printing form with intermediate rinsing and gumming, no corresponding interferences can be observed either. Several thousand satisfactory impressions can be made from the developed plate in an offset printing machine.

EXAMPLE 2

A solution composed of 4.0 pbw of a copolymer of methyl methacrylate/ methacrylic acid (82:18) with an acid value of 110, 4.0 pbw of trimethylolethane triacrylate, 0.07 pbw of 4-dimethylamino-4'-methyldibenzalacetone, 0.1 pbw of 9-phenylacridine, 0.1pbw of 2,4-bistrichloromethyl-6-(4-styrylphenyl)-s-triazine, 0.04 pbw of an azo dyestuff composed of 1,4-dinitro-6-chlorobenzenediazonium salt and 2-methoxy-5-acetylamino-N-cyanoethyl-N-hydroxyethylaniline, 38 pbw of glycol monoethyl ether and 18 pbw of butyl acetate is applied to electrolytically roughened and anodization-hardened 0.3 mm thick aluminum by spinning on and dried such that a layer weight of 2.5 g/m² is obtained.

After drying, the photopolymerizable layer is coated over with a solution of 5 parts by weight of polyvinyl alcohol having a K value of 8 and 12% unsaponified acetyl groups in 95 parts by weight of demineralized water so that a top layer of 2.5 g/m² is produced. Then exposure is carried out for 20 seconds with the light source specified in Example 1 under a 13-step exposure wedge, followed by development with the development concentrates of Examples A to M which have previously been diluted with tap water in the specified ratio. It is only possible to develop without difficulties using developers B and G to M. Developers A and C to F are not capable of dissolving away the top layer with a high productivity and the developers C to F exhibit, in addition, turbidities, precipitates and phase separations.

EXAMPLE 3

The layer base used for printing plates is electronically roughened and anodized aluminum which has a 3 g/m² oxide layer and which has been pretreated with an aqueous solution of polyvinylphosphonic acid. The base is coated with a solution of the following composition:

2.84 pbw of a 22.3%-strength solution of a terpolymer of styrene, n-hexyl methacrylate and methacrylic acid (10:60:30) with an acid value of 190 in methyl ethyl ketone, 1.49 pbw of the reaction product of triethanolamine with 3 mol of isocyanatoethyl methacrylate, 0.04 pbw of alcohol-soluble eosin (C.I. 45386), 0.03 pbw of 2,4-bistrichloromethyl-6-(4-styrylphenyl)-s-triazine,and 0.049 pbw of 9-phenylacridine in 22 pbw of propylene glycol monomethyl ether.

The application is carried out by spinning on in a manner such that a dry weight of 2.8 to 3 g/m² is obtained. The plate is then dried for two minutes at 100° C. in a circulating-air oven. The plate is then coated with a 15%-strength aqueous solution of polyvinyl alcohol (12% residual acetyl groups, K-value 4). After drying, a top layer having a weight of 4 to 5 g/m² is obtained. The printing plate obtained is exposed with a 5 kW metal halide lamp at a distance of 110 cm under a 13-step exposure wedge with density increments of 0.15 on which, if specified, a silver film with uniform optical density (density 1.57) and uniform absorption over the effective spectral range is additionally mounted as a gray filter.

In order to test the sensitivity of the printing plate in visible light, 3 mm thick cut-off filters supplied by Schott with the cut-off transmission specified in Table II are in each case mounted on the exposure wedge. After exposure, the plate is heated for 1 minute at 100° C. Then it is developed with the developers A to M.

The result agrees with that of Example 2: only the developers B and G to M are suitable.

After development, the plate is inked with greasy printing ink. The following fully crosslinked wedge steps are obtained. The resolving power of the printing plate is determined with a test master, the PMS wedge (FOGRA), and read off from the copy.

TABLE II

| Exposure (seconds) | Gray filter | Cut-off filter | Wedge steps | Resolution ($\mu$m) |
|---|---|---|---|---|
| 10 | Yes | — | 11 | 25 |
| 10 | No | 455 | 9 | 25 |

EXAMPLES 4 to 10

Oxygen-inhibiting top layers are applied to the base material and the photopolymer layer from Example 3 from the following solutions to produce a dry layer weight of about 2 g/m²:

100 pbw of a 7%-strength aqueous solution of polyvinyl alcohol (12% residual acetyl groups, K-value 4, i.e. viscosity of a 4%-strength aqueous solution at 20° C.: 4.0 mPa.s), 0.4 pbw of a polymer according to Table II.

The results are summarized in Table III.

TABLE III

| Example No. | Polymer | Brookfield viscosity (mPa · s) | Molecular weight | Trade name/ manufacturer |
|---|---|---|---|---|
| 4 | PEI | 17,000–28,000 | | Polymin P (BASF) |
| 5 | PEI | 500–1000 | | Polymin SK " |
| 6 | PEI | 450–1500 | | Polymin SR " |
| 7 | PEI | 400–900 | | Polymin RN " |
| 8 | PEI | | 60,000 | Corcat P6000 (Virginia Chemicals) |
| 9 | PEI | | 1,000 | Corcat P18* " |
| 10 | PEI | | 1,200 | Corcat P12* " |

PEI = Polyethyleneimine
* = Chemical Abstracts, registry number CAS 9002-98-6

The printing plates are processed as specified in Example 3. The development is carried out with developer K in a dilution of 2:1.

Table IV summarizes the results. The specified fully crosslinked wedge steps are obtained under a 455 nm cut-off filter with an exposure time of 10 seconds.

TABLE IV

| | Example | | | | | | |
|---|---|---|---|---|---|---|---|
| | 4 | 5 | 6 | 7 | 8 | 9 | 10 |
| Wedge steps | 7 | 8 | 8 | 7 | 8 | 8 | 7 |

No turbidities or precipitates are observed in the diluted concentrate of the developer K. The development times are practical and the non-image areas are cleanly developed. No flake or filament formation can be observed. Even when the diluted developer concentrates are used in a standard machine for developing and producing a printing form with intermediate rinsing and gumming, no corresponding interferences are to be observed. Several thousand satisfactory impressions can be produced from the developed plate in an offset printing press.

The photosensitive layers presented in the following examples can also be developed well with the developers according to the present invention after application to a base and subsequent exposure to an image.

EXAMPLE 11

A photosensitive layer is produced from the following constituents:
- 0.45 pbw of a copolymer of 82% methyl methacrylate and 18% methacrylic acid (acid value 117),
- 1.05 pbw of a polymer prepared by reflux heating using a polyvinyl butyral with a molecular weight of about 70,000 to 80,000 which contains 71% vinyl butyral, 2% vinyl acetate and 27% vinyl alcohol units, maleic anhydride, methyl ethyl ketone and trimethylamine,
- 0.45 pbw of the diazonium salt polycondensation product as in Example 1,
- 0.04 pbw of 85%-strength phosphoric acid,
- 0.09 pbw of Victoria pure blue FGA (C.I. basic blue 81),
- 1.5 pbw of pentaerythritol tetraacrylate/ triacrylate (technical mixture),
- 0.007 pbw of phenylazodiphenylamine,
- 0.12 pbw of 2- (4-styrylphenyl) -4,6-bistrichloromethyl-s-triazine in
- 47.7 pbw of ethylene glycol monomethyl ether, and
- 48.6 pbw of butanone.

The layer weight after drying is 1.8 g/m$^2$.

The plate is then coated with a 15%-strength aqueous solution of polyvinyl alcohol (12% residual acetyl group, K-value 4). After drying, a top layer having a weight of 1 g/m$^2$ is obtained.

The layer obtained can be developed well with the developers B and G to M.

EXAMPLE 12.

A photosensitive layer is prepared from the following constituents:
- 2.0 pbw of a styrene/maleic anhydride copolymer partially esterified with alkanol having a mean molecular weight of 20,000 and an acid value around 200,
- 2.0 pbw of a diurethane prepared by reacting glycerol dimethacrylate with hexamethylene diisocyanate,
- 25 pbw of 9-phenylacridine,
- 0.05 pbw of a blue dyestuff obtained by coupling 2,4-dinitro-6-chlorobenzenediazonium salt with 2-methoxy-5-acetamino-N-cyanoethyl-N-hydroxyethylaniline in
- 25.0 pbw of butanone and
- 2.0 pbw of butyl acetate.

The layer weight after drying is 3.7 g/m$^2$.

The layer obtained can be developed well with the developers A and B and also G to M.

What is claimed is:

1. A developer concentrate comprising, in admixture: water, from 0.5 to 15% by weight of at least one organic solvent, from 1.5 to 8% by weight of at least one alkali agent, from 0.2 to 15% by weight of at least one anionic surfactant, from 1 to 16% by weight of at least one component selected from the group consisting of n-aklanoic acid, a salt of n-alkanoic acid and a mixture thereof, from 0.1 to 10% by weight of at least one emulsifier, from 0.1 to 9% by weight of at least one complexing agent comprising an alkali-metal salt of a compound selected form the group consisting of an oligomeric phospahte, N-(2-hydroxyethyl) ethylenediaminetriacetic acid, and from 0.5 to 20% by weight of at least one buffering substance comprising tris(hydroxyalkyl)aminomethane.

2. A developer concentrate according to claim 1, wherein the amount of said buffering substance present in said concentrate is about 0.7 to 10.0% by weight.

3. A developer concentrate according to claim 1, wherein said buffering substance comprises a tris(hydroxy($C_1$–$C_4$)alkyl)aminomethane.

4. A developer concentrate according to claim 3, wherein said buffering substance comprises a tris(hydroxymethyl)aminomethane.

5. A developer concentrate according to claim 1, wherein the amount of said complexing agent present in said concentrate is about 0.5 to 6.0% by weight.

6. A developer concentrate according to claim 5, wherein the amount of said complexing agent present in said concentrate is about 2.0 to 6.0% by weight.

7. A developer concentrate according to claim 1, wherein said complexing agent comprises an alkali-metal salt of an oligophosphate having 2 to 10 phosphorus units.

8. A developer concentrate according to claim 7, wherein said complexing agent comprises an alkali-metal salt of an oligophosphate having 2 to 6 phosphorus units.

9. A developer concentrate according to claim 8, wherein said complexing agent comprises an alkali-metal salt of an oligophosphate having 2 to 4 phosphorus units.

10. A developer concentrate according to claim 1, wherein said complexing agent comprises the sodium salt of N-(2-hydroxyethyl)ethylenediamine-triacetic acid.

11. A developer concentrate according to claim 1, wherein said n-alkanoic acid and its salts have 8 to 12 carbon atoms.

12. A developer concentrate according to claim 1, wherein the amount of said n-alkanoic acid and its salt present in said concentrate is about 1.5 to 14.0% by weight.

13. A developer concentrate according to claim 1, wherein said n-alkanoic acid is selected from group consisting of caprylic, pelargonic, capr lauric acid.

14. A developer concentrate according to claim 1, wherein the amount of said anionic surface-active agent present in said concentrate is about 1.0 to 8.0% by weight.

15. A developer concentrate according to claim 1, wherein said anionic surface-active agent comprises an alkali-metal salt of a compound selected from the group consisting of octyl sulfate, dodecylbenzenesulfonate, alkyl phenol ether sulfate, naphthalenesulfonate, sulfosuccinate, alkyl ether phosphate and oleic acid methyl tauride.

16. A developer concentrate according to claim 15, wherein said anionic surface-active agent comprises a sodium salt of a compound selected from the group consisting of octyl sulfate, dodecylbenzene sulfonate, alkyl phenol ether sulfate, naphthalene sulfonate, sulfosuccinate, alkyl ether phosphate and oleic acid methyl tauride.

17. A developer concentrate according to claim 1, wherein the amount of said emulsifier present in said concentrate is about 0.2 to 6.0% by weight.

18. A developer concentrate according to claim 1, wherein said emulsifier is selected from the group consisting of poly-N-vinyl-N-methylacetamide, a water-soluble copolymer of N-vinyl-N-methylacetamide, polyvinyl alcohol, dextrin, gum arabic and cellulose ethers.

19. A developer concentrate according to claim 18, wherein said cellulose ether comprises carboxymethyl cellulose.

20. A developer concentrate according to claim 1, wherein the amount of said organic solvent present in said concentrate is about 1.0 to 10.0% by weight.

21. A developer concentrate according to claim 1, wherein said organic solvent is selected from the group consisting of benzyl alcohol, phenoxyethanol, 1-phenylethanol, 2-phenylethanol, propylene glycol monomethyl and monophenyl ether.

22. A developer concentrate according to claim 1, wherein said alkali agent comprises an alkali-metal hydroxide.

23. A developer for developing a negative-working exposed reproduction layer on a base, comprising a developer concentrate according to claim 1 diluted with tap water.

24. A developer according to claim 23, wherein the dilution ratio of said concentrate to tap water is about 1:0 5 to 1:6.

25. A developer concentrate according to claim 1, wherein said complexing agent is an alkali metal salt of an oligomeric phosphate.

26. A developer concentrate according to claim 1, wherein said complexing agent is a mixture of an alkali metal salt of an oligomeric phosphate and an alkali metal salt of N-(2-hydroxyethyl)ethylenediaminetriacetic acid.

27. A developer concentrate according to claim 1, wherein said complexing agent is an alkali metal salt of N-(2hydroxyethyl)ethylenediaminetriacetic acid.

28. A process for producing a printing form which comprises applying a negative-working layer which includes diazonium salt polycondensation resin to a base, exposing said layer to an image and then developing said exposed layer with a developer according to claim 23.

29. A process for producing a printing form, which comprises applying a negative-working layer which includes a photopolymerizable compound to a base, exposing said layer to an image and then developing said exposed layer with a developer according to claim 23.

30. A process for producing a printing form, which comprises applying a negative-working layer which includes a diazonium salt polycondensation resin and a photopolymerizable compound to a base, exposing said layer to an image and then developing said exposed layer with a developer according to claim 23.

31. A process for producing a printing form according to claim 29, wherein said layer further includes a protective top layer.

* * * * *